United States Patent
Agata et al.

(10) Patent No.: US 7,884,642 B2
(45) Date of Patent: Feb. 8, 2011

(54) SYSTEM LSI

(75) Inventors: Yasuhiro Agata, Osaka (JP); Toshiaki Kawasaki, Osaka (JP); Masanori Shirahama, Shiga (JP); Ryuji Nishihara, Osaka (JP); Shinichi Sumi, Hyogo (JP); Yasue Yamamoto, Osaka (JP); Hirohito Kikukawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/722,317

(22) Filed: Mar. 11, 2010

(65) Prior Publication Data

US 2010/0164542 A1 Jul. 1, 2010

Related U.S. Application Data

(62) Division of application No. 11/526,816, filed on Sep. 26, 2006, now Pat. No. 7,696,779.

(30) Foreign Application Priority Data

Oct. 14, 2005 (JP) .............................. 2005-300153

(51) Int. Cl.
*H03K 19/173* (2006.01)
(52) U.S. Cl. ..................... 326/38; 326/41; 257/202; 257/379; 257/529
(58) Field of Classification Search ............. 326/37–41, 326/47; 327/564–566, 319
See application file for complete search history.

(56) References Cited

U.S. PATENT DOCUMENTS 5,699,289 A 12/1997 Takenaka
5,796,299 A 8/1998 Sei et al.
6,424,015 B1 7/2002 Ishibashi et al.
6,460,168 B1 10/2002 Yamamoto et al.
6,480,428 B2* 11/2002 Zheng et al. ................. 365/200
6,657,887 B2 12/2003 Higeta et al.
6,707,314 B2 3/2004 Kasahara et al.
6,836,026 B1 12/2004 Ali et al.
6,900,478 B2* 5/2005 Miyagi ....................... 257/202
7,075,179 B1 7/2006 Ali et al.
7,196,960 B2 3/2007 Isoda et al.
7,397,693 B2 7/2008 Yamaoka et al.
2006/0214721 A1 9/2006 Ikeda et al.
2006/0279330 A1 12/2006 Phoon et al.

FOREIGN PATENT DOCUMENTS

JP 11-512879 11/1999
WO WO 97/12401 4/1997

* cited by examiner

*Primary Examiner*—James H. Cho
*Assistant Examiner*—Christopher Lo
(74) *Attorney, Agent, or Firm*—McDermott Will & Emery LLP

(57) ABSTRACT

A system LSI includes an input/output section and a logic circuit section. The input/output section includes an I/O power source cell having a supply voltage higher than a power source for the logic circuit section and a plurality of I/O cells in each of which an I/O power source line is provided for supplying source power from the I/O power source cell. The logic circuit section includes an I/O power consuming circuit which uses the I/O power source cell as a power source. The I/O power consuming circuit is connected to a line leading from an I/O power source line in at least one of the plurality of I/O cells.

7 Claims, 4 Drawing Sheets

SYSTEM LSI

CROSS REFERENCE TO RELATED APPLICATIONS

This application is a Divisional of U.S. application Ser. No. 11/526,816, filed on Sep. 26, 2006 now U.S. Pat. No. 7,696,779, claiming priority of Japanese Patent Application No. 2005-300153, filed on Oct. 14, 2005, the entire contents of each of which are hereby incorporated by reference.

BACKGROUND OF THE INVENTION

1. Field of the Invention

The present invention relates to a system LSI including a logic circuit section and an input/output section having a plurality of I/O cells, and particularly relates to a system LSI including a circuit which uses an I/O power source as well as the I/O cells.

2. Background Art

System LSIs in recent years employ a structure in which I/O cells (an input/output section) for input/output are arranged around an LSI and are driven by an I/O power source (at 2.5 V, for example) while logic cells or RAM cells (a logic circuit section) which operate at low voltages are arranged within a range surrounded by the I/O cell group and are driven by a CORE power source (at 1.0 V, for example).

Also, electric fuse circuits have been employed conventionally as programming devices for redundancy relief in memories and the like (see Published Japanese Translation of PCT International Application No. 11-512879). Though voltages higher than that used in ordinary MOS transistors had been required for programming the conventional electric fuse circuits, progress in miniaturization in recent years in the 130 nm process generation enables a fuse element formed of a gate material to be programmed with the use of a power source (an I/O power source) of which power an input/output circuit consumes usually.

Consider here the case where an electric fuse circuit which uses an I/O power source as a power source for programming is arranged in a system LSI and is connected to the power source. In this case, it is necessary to draw a power source line from an I/O power source cell to a logic circuit section and to extend it to the electric fuse circuit for connection.

While, for programming the electric fuse circuit, an electric current of approximately 10 to 20 mA is necessary. For this reason, the power source line from the I/O power cell to the electric fuse circuit should have low impedance, and therefore, has a wide width. This is unfavorable in view of area efficiency of the system LSI. This problem may occur not only with the electric fuse circuit but also with any other circuits using the I/O power source as a power source.

SUMMARY OF THE INVENTION

The present invention has its object of enabling connection between an I/O power source and a circuit using the I/O power source as a power source at low impedance with no wide power source line necessitated in a system LSI.

Specifically, the present invention provides a system LSI including an input/output section and a logic circuit section, wherein the input/output section includes: an I/O power source cell having a power supply voltage higher than a power source for the logic circuit section; and a plurality of I/O cells in each of which an I/O power source line is provided for supplying source power from the I/O power source cell, and the logic circuit section includes: an I/O power consuming circuit which uses the I/O power source cell as a power source, the I/O power consuming circuit being connected to a line leading from the I/O power source line in at least one of the plurality of I/O cells.

In this invention, the I/O power consuming circuit which uses the I/O power source cell as a power source is connected to the line leading from an I/O power source line in at least one of the plurality of I/O cells. In other words, the I/O power source line, which is provided in each I/O cell basically, is used for connecting the I/O power consuming circuit and the I/O power source cell. With this arrangement, the I/O power consuming circuit can be connected to the I/O power source cell at low impedance with no wide power source line necessitated. Hence, a high performance system LSI in which the I/O power consuming circuit is arranged can be attained with a smaller area.

The present invention provides another system LSI including: an I/O cell which includes a pad connected to an external terminal and in which an I/O power source line for supplying source power from an I/O power source cell is provided; and an I/O power consuming circuit which is provided in a layer below the pad and uses the I/O power source cell as a power source, wherein the I/O power consuming circuit is connected to the I/O power source line in the I/O cell.

In this invention, the I/O power consuming circuit which uses the I/O power source cell as a power source is provided in the layer below the pad that the I/O cell includes and is connected to the I/O power source line in the I/O cell. As a result, the I/O power consuming circuit is located close to the I/O power source line, so that the line for connecting them is shortened with no wasted circuit area. Hence, an excellent system LSI in which the I/O power source cell is connected to the I/O power consuming circuit at low impedance can be achieved with no area overhead.

Further, the present invention provides a system LSI, including: first and second I/O cells each of which has a pad connected to an external terminal and in each of which an I/O power source line is provided for supplying source power from an I/O power source cell; a filler cell which is provided between the first I/O cell and the second I/O cell and in which the I/O power source line is provided; and an I/O power consuming circuit which is provided in a layer below the filler cell and uses the I/O power source cell as a power source, wherein the I/O power consuming circuit is connected to the I/O power source line in the filler cell.

In this invention, the I/O power consuming circuit which uses the I/O power source cell as a power source is provided in the layer below the filler cell and is connected to the I/O power source line in the filler cell. As a result, the I/O power consuming circuit is located close to the I/O power source line, so that the line for connecting them is shortened with no wasted circuit area. Hence, an excellent system LSI in which the I/O power source cell is connected to the I/O power consuming circuit at low impedance can be achieved with no area overhead.

As described above, the present invention realizes a high performance system LSI with a smaller area in which the I/O power consuming circuit is arranged.

DESCRIPTION OF THE PREFERRED EMBODIMENTS

Embodiments of the present invention will be described below with reference to the accompanying drawings.

Embodiment 1

Figure 1:
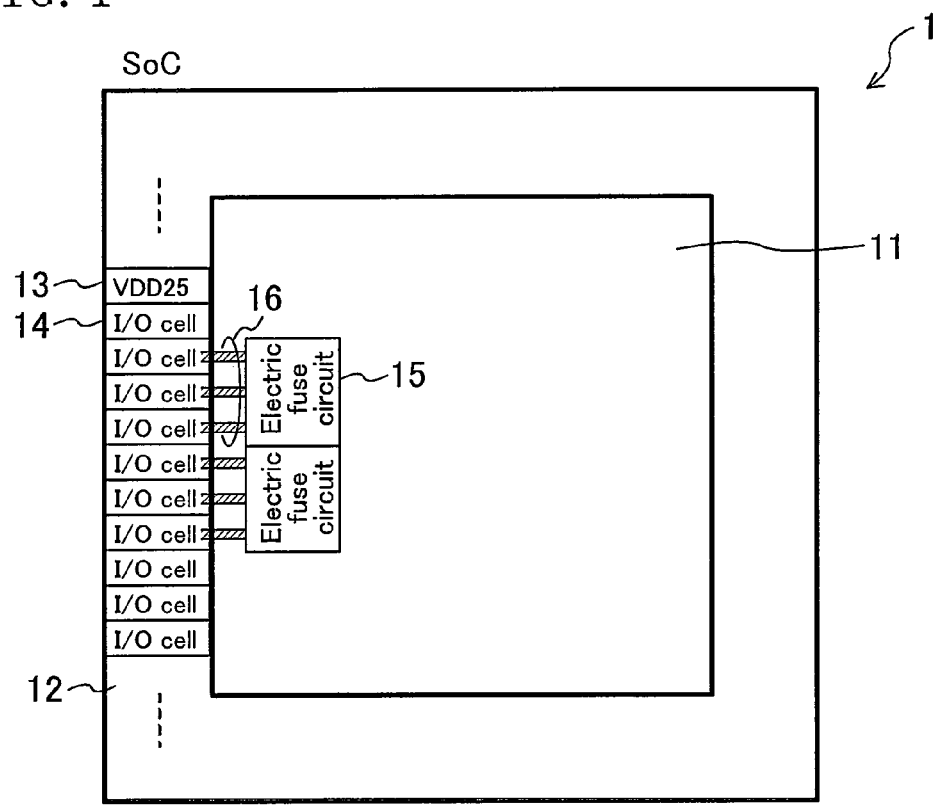
FIG. 1 is a diagram showing a structure of a system SLI according to Embodiment 1 of the present invention.
Figure 2:
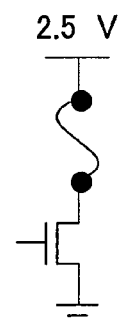
FIG. 2 is a circuit diagram of an electric fuse circuit.

FIG. 1 is a diagram showing a structure of a system LSI according to Embodiment 1 of the present invention. In FIG. 1, the system LSI (SoC) 1 includes a logic circuit section 11 and an input/output section 12 arranged therearound. The input/output section 12 includes a 2.5V power source cell 13 as an I/O power source cell and a plurality of input/output cells (I/O cells) 14. The logic circuit section 11 includes electric fuse circuits 15 as first I/O power consuming circuits in addition to various logic circuits and RAMs, and the like. The electric fuse circuits 15 use the 2.5 V power source cell 13 as a power source for programming. FIG. 2 is a circuit diagram of an electric fuse circuit. Each electric fuse circuit 15 is connected to a 2.5 V power source line 16 as a first line leading (drawn) from an I/O power source line in at least one (three in FIG. 1) of the I/O cells 14.

Figure 3:
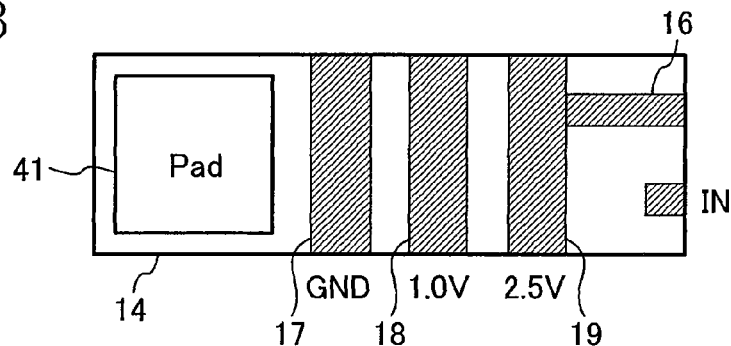
FIG. 3 is a layout diagram of an I/O cell.
Figure 4:
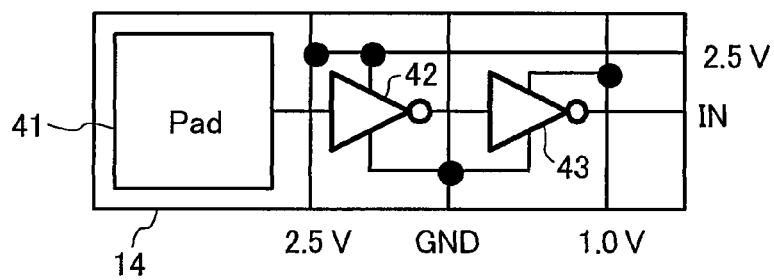
FIG. 4 is a circuit diagram of the I/O cell.

FIG. 3 and FIG. 4 are a layout diagram and a circuit diagram of an I/O cell 14, respectively, as one example. In FIG. 3 and FIG. 4, reference numeral 17 denotes a ground line, 18 denotes a 1.0 V line, 19 denotes a 2.5 V power source line as an I/O power source line for supplying electric power from the 2.5 V power source cell 13, 41 denotes a pad for connection to an external terminal, 42 denotes an inverter using electric power at 2.5 V, 43 is an inverter using electric power at 1.0 V. The 2.5 V power source line 19 is connected to each electric fuse circuit 15 by means of the 2.5 V power source line 16.

In general, a power source (an I/O power source) having a voltage higher than a power source (a CORE power source) for the logic circuit section 11 inside the system LSI is used in the input/output section 12 for communication with the outside. For this reason, an I/O power source (the 2.5 V power source cell 13) is arranged in the input/output section 12. The logic circuit section 11 needs no I/O power source in contrast, and therefore, the I/O power source is formed only in the input/output section 12.

Each electric fuse circuit 15 which uses the I/O power source as a power source for programming, which is used as a programming element for RAM's redundancy replacement or the like, is arranged between the RAMs and the I/O cells 14, for example. In view of this, as shown in FIG. 1 and FIG. 3, each electric fuse circuit 15 is connected electrically to the 2.5 V power source cell 13 by means of the 2.5 V line 19 provided in each I/O cell 14 and the 2.5 V line 16 leading from the 2.5 V line 19. With this arrangement, the I/O power source is connected to each electric fuse circuit 15 at low impedance with the use of the I/O power source lines formed within the I/O cells 14. This eliminates the need to form and draw a wide power source line from the 2.5 V power source cell 13, attaining a system LSI with a minimum area.

Electric fuse circuits are programmed at inspection for product shipment or the like, and no operation for programming the electric fuse circuits is performed in the normal operation of system LSIs. Accordingly, the electric fuse circuits consume no electric current from the I/O power source in the normal operation. In turn, electric connection of the electric fuse circuits 15 to the 2.5 V power source cell 13 by means of the 2.5 V line 19 in the I/O cells involves no influence on the characteristics of the system LSI.

It is noted that it is preferable to form the 2.5 V lines 16 in the lowest wiring layer or the second lowest wiring layer. In general, the metals of the lowest layer and the second lowest layer are used as local lines in system LSIs. For this reason, a line for connecting the logic circuit section (CORE) 11 to the input/output section 12 is formed of a metal line in the third lowest layer or an upper layer thereof in many cases. In view of this, when the 2.5 V lines 16 located close to the I/O cells 14 are formed in the lowest metal layer or the second lowest metal layer, the wiring layers can be used effectively, attaining an excellent system LSI with a smaller area.

Embodiment 2

Figure 5:
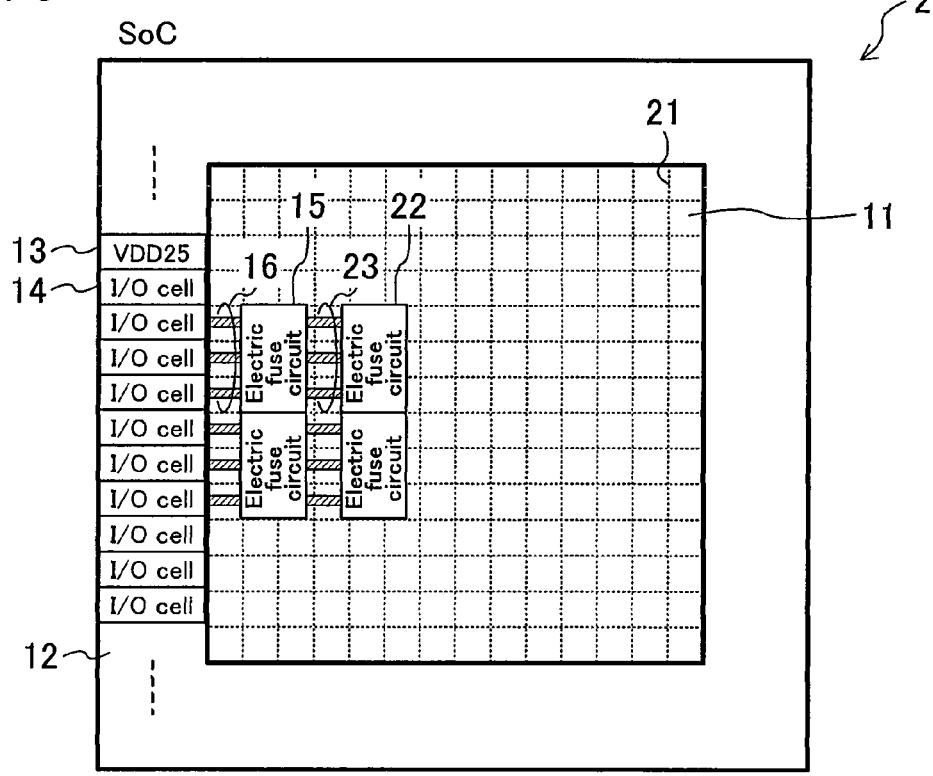
FIG. 5 is a diagram showing a structure of a system LSI according to Embodiment 2 of the present invention.

FIG. 5 is a diagram showing a structure of a system LSI according to Embodiment 2 of the present invention. In FIG. 5, the same reference numerals are assigned to the constitutional elements common to those in FIG. 1. In the system LSI shown in FIG. 5, a ground line 21 in a mesh-like form is arranged in the logic circuit section 11. Further, electric fuse circuits 22 as second I/O power consuming circuits are provided on the opposite side of the electric fuse circuits 15 from the I/O cells 14. The electric fuse circuits 22 are connected to the electric fuse circuits 15 by means of 2.5 V lines 23 as second lines for supplying electric power from the 2.5 V power source cell 13.

Power sources and grounds for the logic circuits and the RAMs arranged in the logic circuit section 11 are connected to low-impedance lines usually in mesh-like forms connected to a power source or a ground pad, respectively. For programming an electric fuse circuit, an electric current flowing from the I/O power source to the ground is consumed. In the present embodiment, the ground line 21 in a mesh-like form is connected to the electric fuse circuits 15, 22. This attains a system LSI including the electric fuse circuits connected to the low-impedance ground line.

Electric fuse circuits are programmed at inspection for product shipment or the like, and no operation for programming the electric fuses is performed in the normal operation of system LSIs. Accordingly, the ground line consumes no electric current in the normal operation, involving no influence on the characteristics of the system LSI.

Further, in the present embodiment, the fuse electric circuits 15, 22 are arranged in parallel and are connected to each other by means of the 2.5 V lines 23. As a result, the electric fuse circuits 22, which are located farther from the I/O cells 14, can be connected to the I/O power source at low impedance.

It should be noted that it is preferable to form the 2.5 V lines 23 in the lowest wiring layer or the second lowest wiring layer. In general, metals of the lowest layer and the second lowest layer are used as local lines in system LSIs. Accordingly, formation of metal lines in the lowest layer or the second lowest layer as the 2.5 V lines 23 for connecting the electric fuse circuits 15, 23 attains effective use of the wiring layers, resulting in an excellent system LSI with a smaller area.

Embodiment 3

Figure 6A:
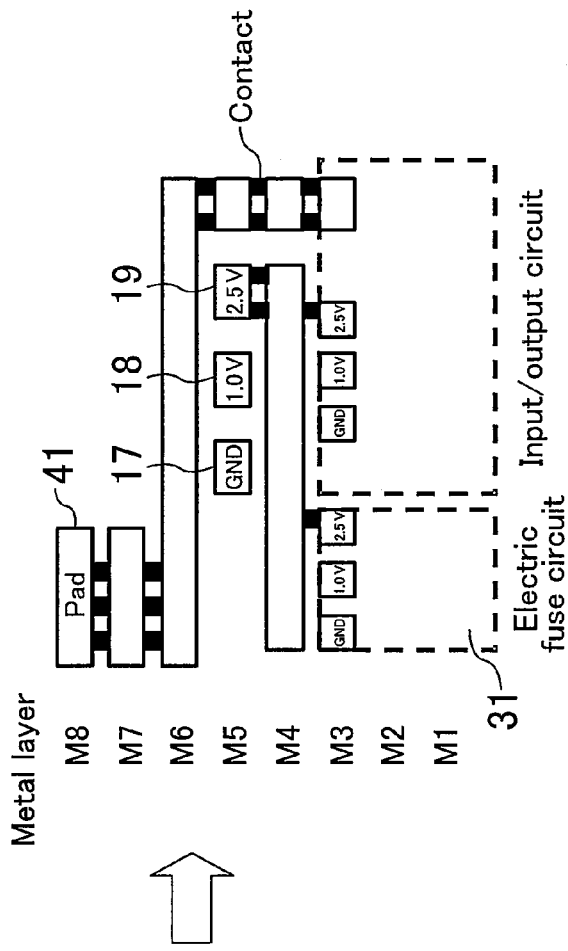
FIG. 6 is a diagram showing a configuration of an I/O cell group in a system LSI according to Embodiment 3 of the present invention.
Figure 6B:
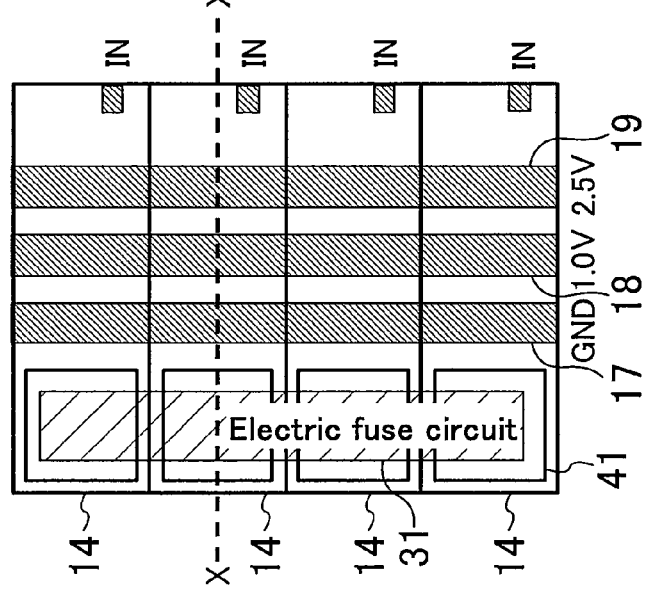
Figure 7B:
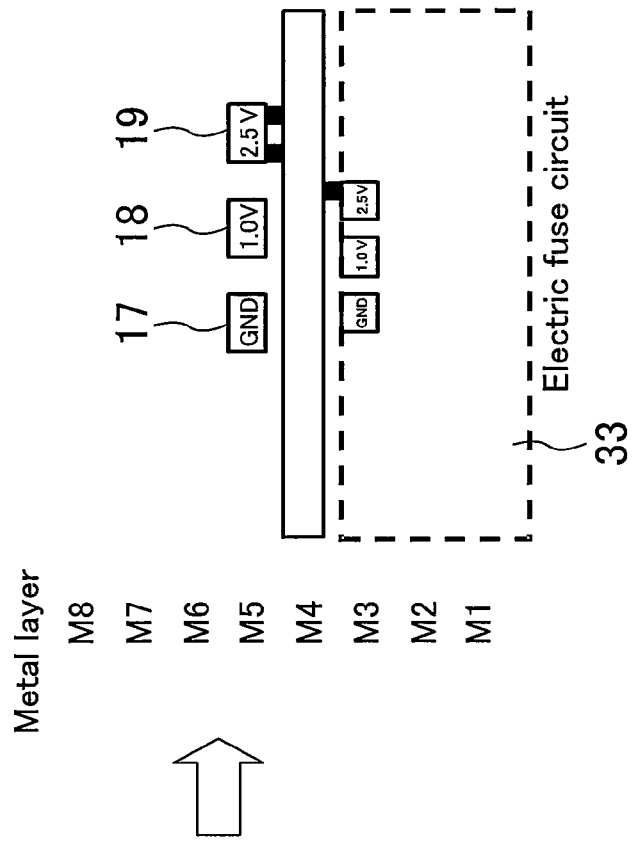
FIG. 7 is a diagram showing a configuration of an I/O cell group in another system LSI according to Embodiment 3 of the present invention.
Figure 7A:
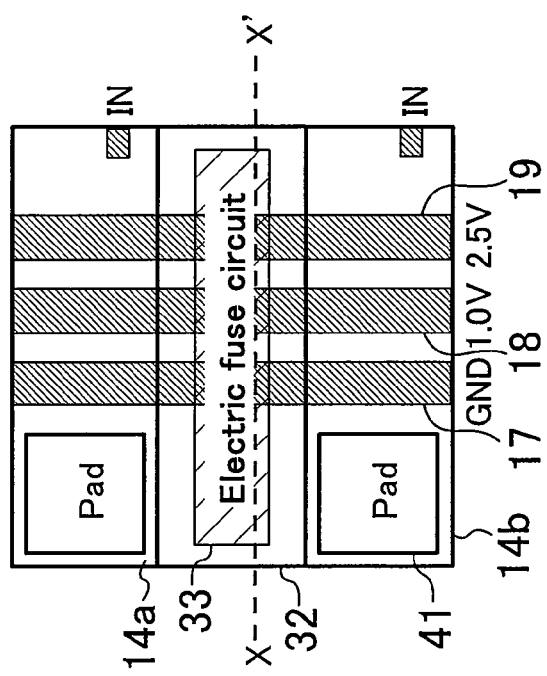

FIG. 6 and FIG. 7 are diagrams showing I/O cell groups in system LSIs according to Embodiment 3 in the present invention, wherein FIG. 6A and FIG. 7A are layout diagrams, and FIG. 6B and FIG. 7B are sectional views taken along the broken lines X-X' in FIG. 6A and FIG. 7A, respectively. The same reference numerals are assigned to the constitutional elements common to those in FIG. 3

In FIG. 6, each I/O cell 14 includes a pad 41 connected to an external terminal and is provided with the ground line 17, the 1.0 V line 18, and the 2.5 V line 19. An electric fuse circuit 31 as an I/O power consuming circuit is provided in a layer below the pads 41. The electric fuse circuit 31 is connected electrically to the 2.5 V line 19 through a wiring layer M4.

Alternatively, in FIG. 7, a filler cell 32 is provided between a first I/O cell 14a and a second I/O cell 14b. The ground line 17, the 1.0V line 18, and the 2.5V line 19 are provided in each of the first and second I/O cells 14a, 14b and the filler cell 32. An electric fuse circuit 33 as an I/O power consuming circuit is provided in a layer below the filer cell 32. The electric fuse circuit 33 is connected to the 2.5 V line 19 through the line layer M4.

In system LSIs in recent years, multilayer wiring progresses, and 8 to 12 wiring layers are formed. The pads of the I/O cells are formed in an upper wiring layer, forming a dead area at a part below the pads in some cases. In view of this, as shown in FIG. 6, the electric fuse circuit 31 formed of two or three wiring layers is arranged below the pads 41 of the I/O cells 14. This results in an arrangement of the electric fuse circuit 31 close to the I/O power source line, that is, the 2.5 V line 19, shortening the line for connecting them with no wasted circuit area. Hence, an excellent system LSI in which the I/O power source is connected to the electric fuse circuit at low impedance can be attained with no area overhead.

Some system LSIs are provided with only a power source line with no input/output circuit thereof provided and includes a generally-called filler cell having a function of connecting the I/O cells. In view of this, as shown in FIG. 7, the electric fuse circuit 33 formed of two or three wiring layers is arranged below the filler cell 32. As a result, the electric fuse circuit 33 is located close to the I/O power source line, that is, the 2.5 V line 19, shortening the line for connecting them with no wasted circuit area. Hence, an excellent system LSI in which the I/O power source is connected to the electric fuse circuit at low impedance can be attained with no area overhead.

The voltages of the I/O power source and the CORE power source are set to 2.5 V and 1.0 V, respectively, in each of the above embodiments, but the power supply voltages in the present invention are not limited thereto.

Further, each of the above embodiments exemplifies the electric fuse circuits, but the present invention is not limited thereto and is applicable to the case where any other circuits using the I/O power source as a power source are arranged, as well.

In each of the above embodiments, the input/output section surrounds the logic circuit section in the system LIS, but the positional relationship between the logic circuit section and the input/output section is not limited thereto.

The present invention is useful for area minimization of an system LSI in which an electric fuse circuit having excellent program characteristics is arranged.

What is claimed is:

1. A system LSI, comprising an input/output section and a logic circuit section,
   wherein the input/output section includes:
   an I/O power source cell; and
   a plurality of I/O cells in each of which an I/O power source line is provided for supplying source power from the I/O power source cell, and
   the logic circuit section includes:
   a first I/O power consuming circuit which uses the I/O power source cell as a power source such that a power supply voltage to said first I/O power consuming circuit is higher than a power supply voltage to another portion of said logic circuit section, the first I/O power consuming circuit being connected to a first line leading from the I/O power source line in at least one of the plurality of I/O cells,
   wherein the first I/O power consuming circuit is an electric fuse circuit which uses the I/O power source cell as a power source for programming.

2. The system LSI of claim 1, wherein the input/output section is arranged around the logic circuit section.

3. The system LSI of claim 1, wherein the first line connects the first I/O power consuming circuit and the I/O power source lines of two or more of the plurality of I/O cells.

4. The system LSI of claim 1, wherein the first line is formed in a lowest wiring layer or a second lowest wiring layer.

5. The system LSI of claim 1, wherein the logic circuit section includes a second I/O power consuming circuit which is arranged on an opposite side of the first I/O power consuming circuit from the plurality of I/O cells and uses the I/O power source cell as a power source, and
   the second I/O power consuming circuit is connected to the first I/O power consuming circuit by means of a second line for supplying source power from the I/O power source cell.

6. The system LSI of claim 5, wherein the second line is formed in a lowest wiring layer or a second lowest wiring layer.

7. The system LSI of claim 1, wherein the logic circuit section includes a ground line in a mesh-like form, and
   the first I/O power consuming circuit is connected to the ground line.

* * * * *